(12) United States Patent
Yang et al.

(10) Patent No.: US 7,271,021 B2
(45) Date of Patent: Sep. 18, 2007

(54) LIGHT-EMITTING DEVICE WITH A CURRENT BLOCKING STRUCTURE AND METHOD FOR MAKING THE SAME

(75) Inventors: Tsun-Neng Yang, Taoyuan (TW); Shan-Ming Lan, Taoyuan (TW)

(73) Assignee: Atomic Energy Council-Institute of Nuclear Energy Research, Lungtan, Taoyuan (TW)

( * ) Notice: Subject to any disclaimer, the term of this patent is extended or adjusted under 35 U.S.C. 154(b) by 185 days.

(21) Appl. No.: 11/236,810

(22) Filed: Sep. 28, 2005

(65) Prior Publication Data

US 2006/0022222 A1     Feb. 2, 2006

Related U.S. Application Data

(62) Division of application No. 10/688,502, filed on Oct. 17, 2003, now Pat. No. 7,009,214.

(51) Int. Cl.
    *H01L 21/00* (2006.01)
(52) U.S. Cl. .................. 438/37; 257/101; 257/E33.001
(58) Field of Classification Search .................. 438/37; 257/82, 101
    See application file for complete search history.

(56) References Cited

U.S. PATENT DOCUMENTS

| 5,153,889 | A | 10/1992 | Sugawara et al. |
| 5,717,226 | A | 2/1998 | Lee et al. |
| 5,949,093 | A | 9/1999 | Tamamura |
| 5,994,723 | A * | 11/1999 | Sekii et al. ................... 257/99 |
| 6,420,732 | B1 | 7/2002 | Kung et al. |
| 6,522,676 | B1 | 2/2003 | Goto et al. |
| 6,621,106 | B2 | 9/2003 | Murakami et al. |
| 2003/0039288 | A1 | 2/2003 | Kimura |

FOREIGN PATENT DOCUMENTS

EP        1225670        7/2002

* cited by examiner

*Primary Examiner*—Quoc Hoang
(74) *Attorney, Agent, or Firm*—Egbert Law Offices

(57) ABSTRACT

A light emitting device includes a substrate, an epitaxial structure positioned on the substrate, an ohmic contact electrode positioned on the epitaxial structure and a current blocking structure positioned in the epitaxial structure. The epitaxial structure includes a bottom cladding layer, an upper cladding layer, a light-emitting layer positioned between the bottom and the upper cladding layer, a window layer positioned on the upper cladding layer and a contact layer positioned on the window layer. The current blocking structure can extend from the bottom surface of the ohmic contact electrode to the light-emitting layer. According to the present invention, at least one ionic implanting process is performed to implant at least one proton beam into the epitaxial structure to form the current blocking structure.

12 Claims, 9 Drawing Sheets

LIGHT-EMITTING DEVICE WITH A CURRENT BLOCKING STRUCTURE AND METHOD FOR MAKING THE SAME

RELATED U.S. APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

FIELD OF THE INVENTION

The present invention relates to a light-emitting device and method for making the same, and more particularly, to a light-emitting device with a current blocking structure and method for making the same using ionic implanting technology.

BACKGROUND OF THE INVENTION

In the past 40 years, countries all over the world have spared no effort in developing new materials for light-emitting devices (LED) and improving their internal quantum efficiency. However, the external quantum efficiency of LEDs is still far behind the internal quantum efficiency. The internal quantum efficiency of LEDs with double heterojunction (DH) structure can be up to 99%, while the external quantum efficiency is only several percent, which is a result of the following reasons: (1) The electric current distribution of the p-type cladding layer, the p-type window layer and the p-type contact layer on the light-emitting layer of the LED results in that most photons are reflected back by the p-type ohmic contact electrode and finally absorbed by the substrate, which reduces the probability of photons emitted out of the LED; (2) It is difficult for photons to be emitted to the air with low refractivity index (n=1) from semiconductor materials with high refractivity index, and most photons are absorbed by the substrate.

Commercial high-luminance LEDs, such as red, yellow, green and blue LEDs, all presently use either a aluminum gallium indium phosphide/gallium arsenide substrate or a aluminum indium gallium nitride/sapphire single crystal substrate, and use Metal-Organic Chemical Vapor Deposition (MOCVD) technology to grow the epitaxial film of the LED.

FIG. 1 is a cross-sectional diagram of an LED 10 according to the prior art. As shown in FIG. 1, the LED 10 comprises a gallium arsenide (GaAs) substrate 12, a bottom cladding layer 14 composed of n-type aluminum gallium indium phosphide (n-AlGaInP), a light-emitting layer 16 composed of undoped aluminum gallium indium phosphide, and an upper cladding layer 18 composed of p-type aluminum gallium indium phosphide (p-AlGaInP). In addition, the LED 10 also comprises a p-type ohmic contact electrode 22 positioned on the surface of the upper cladding layer 18, and an n-type ohmic contact electrode 20 positioned on the bottom surface of the gallium arsenide substrate 12. The p-type ohmic contact electrode 22 is a metallic film with a diameter about 150 micrometers for wire bonding. The current applied to the LED 10 flows from the p-type ohmic contact electrode 22 via the upper cladding layer 18 to the light-emitting layer 16 where photons are generated.

Since the upper cladding layer 18 of p-type aluminum gallium indium phosphide has a higher resistance and small thickness, it is difficult for the current to be spread laterally and uniformly, which results in that most of the current is concentrated right below the p-type ohmic contact electrode 22. However, photons generated at the light-emitting layer 16 right below the p-type ohmic contact electrode 22 are screened by the p-type ohmic contact electrode 22 and reflected back when the photons try to emit out of the LED 10, and most photons will be absorbed finally by the gallium arsenide substrate 12 with a smaller band gap. As a result, the external quantum efficiency of the LED 10 is restricted.

The LED 10 uses the upper cladding 18 composed of p-type aluminum gallium indium phosphide to spread the current directly, which results in three problems: (1) The carrier mobility of the p-type aluminum gallium indium phosphide is quite low, only about 10 (cm$^2$/V-s); (2) It is difficult to perform an ionic implanting process on the p-type aluminum gallium indium phosphide such that the maximum carrier concentration is only about $10^{18}$/cm$^3$; (3) When the thickness of the p-type aluminum gallium indium phosphide is decreased to a range between 2 and 5 micrometers, the quality of the aluminum gallium indium phosphide is inferior.

FIG. 2 is a cross-sectional diagram of an LED 30 according to the prior art. Compared with the LED 20 in FIG. 1, the LED 30 further comprises a p-type window layer 32 on the upper cladding layer 18. The p-type window layer 32 with a thickness between 2 and 50 micrometers is epitaxially grown on the upper cladding layer 18 to overcome the above-mentioned problems. Currently, semiconductor materials widely used to form the window layer include indium aluminum phosphide, aluminum gallium arsenide, gallium nitride, gallium phosphide, etc. The p-type window layer 32 not only possesses a lower resistance, but is also transparent to photons emitted from the light-emitting layer 16, namely photons will not be absorbed. Researchers have successfully developed an aluminum gallium indium phosphide high-luminance red LED using the p-type window layer 32. Toshiba Corporation in Japan used the p-type aluminum gallium arsenide to prepare the window layer and the current spreading layer in 1991, which increases the external quantum efficiency of the LED by about 40 times. After that, HP Corporation in America used the p-type gallium arsenide with a thickness between 2 and 15 micrometers to prepare the window layer, which effectively promotes the external quantum efficiency of the LED.

FIG. 3 is a cross-sectional diagram of an LED 40 according to the prior art. Compared with the LED 30 in FIG. 2, the LED 40 uses a window layer 42 on the upper cladding layer 18 to spread the current laterally, wherein the window layer 42 uses a three-layer epitaxial layer structure, namely gallium phosphide/gallium arsenide/gallium phosphide. The United Photoelectric Corporation in Taiwan has used this film structure to successfully develop an aluminum gallium indium phosphide high-luminance red LED.

FIG. 4 is a cross-sectional diagram of an LED 50 according to the prior art, which uses a transparent electrode 52 to spread current laterally. The transparent electrode 52 composed of indium tin oxide (ITO) is grown on the upper cladding layer 18 composed of p-type aluminum gallium indium phosphide, thus the electric current of the LED 50 is spread to the upper cladding layer 18 laterally via the transparent electrode 52. The Industrial Technology Research Institute of Taiwan, ROC, used this film structure to develop the aluminum gallium indium phosphide high-luminance red LED successfully. However, since it is difficult to form a good ohmic contact property between the ITO and the aluminum gallium indium phosphide, a graded layer 54 composed of p-type gallium arsenide is required to be added between the ITO and the aluminum gallium indium phosphide.

FIG. 5 is a cross-sectional diagram of an LED 60 according to the prior art. The LED 60 uses a current blocking structure to force the current to spread laterally, and comprises a p-type window layer 62 on the upper cladding layer 18 and an n-type epitaxial layer 64 between the upper cladding layer 18 and the p-type window layer 62. The n-type epitaxial layer 64 is right below the p-type ohmic contact electrode 22, and forms a p-n junction with the upper cladding 18 for blocking the flow of the current therethrough. The current blocking structure of the LED 60 can effectively spread the current laterally to the region around the p-type ohmic contact electrode 22, rather than concentrate around the central region. As a result, the probability of photons generated at the light-emitting layer 16 and screened by the p-type ohmic contact electrode 22 is decreased, and the external quantum efficiency of the LED 60 is increased. Toshiba Corporation in Japan prepared an LED with the window layer of p-type aluminum gallium arsenide and the n-type island current blocking structure.

If the current blocking structure with the p-n junction is used, two steps are needed during the MOCVD epitaxial growth. Firstly, an n-type epitaxial layer 64 with a width of tens of nanometers has to be grown on the upper cladding layer 18, and the epitaxial wafer is then moved out from the reaction chamber to form the n-type epitaxial layer 64 into an island shape through a photolithographic and an etching process. The epitaxial wafer is moved back into the MOCVD reaction chamber to grow the p-type window layer 62. In addition, although the current blocking structure of the LED 60 is positioned above the upper cladding layer 18, the current from the p-type ohmic contact electrode 22 may flow to the light-emitting layer 16 right below the n-type epitaxial layer 64, where the generated photon still can not emit out of the LED 60 due to the screen of the p-type ohmic contact electrode 22.

Presently, there are many available technologies to solve the issue of electric current spreading for the LED. For instance, Sugawara et al. use the selected area diffusion method to prepare the current blocking structure (SEE U.S. Pat. No. 5,153,889). B. J. Lee et al. formed a circular hole with a depth to the upper cladding composed of p-type aluminum gallium indium phosphide in the transparent electrode composed of ITO or ZnO using photolithographic and etching technologies, and a metallic film is deposited in the hole to form an Schokky Barrier. The metallic film is heated to form a natural oxide at the interface between the metallic membrane and the p-type aluminum gallium indium phosphide, wherein the Schokky Barrier and the natural oxide form a current blocking structure (SEE to U.S. Pat. No. 5,717,226). In addition, U.S. Pat. No. 5,949,093, U.S. Pat. No. 6,420,732 B1, EP 1,225,670 A1, U.S. 2001/0050530 A1, U.S. 2003/0039288 A1 and U.S. Pat. No. 6,522,676 B1 also discloses different designs of current blocking structure.

BRIEF SUMMARY OF THE INVENTION

The objective of the present invention is to provide a light-emitting device with a current blocking structure and a method for making the light-emitting device with the current blocking structure using an ionic implanting technology.

In order to achieve the above-mentioned objective, and avoid the problems of the prior art, the light-emitting device of the present invention comprises a substrate, an epitaxial structure positioned on the substrate, an ohmic contact electrode positioned on the epitaxial structure and a current blocking structure positioned in the epitaxial structure. The epitaxial structure comprises an upper cladding layer, a bottom cladding layer, a light-emitting layer positioned between the upper cladding layer and the bottom cladding layer, a window layer positioned on the upper cladding layer and a contact layer positioned between the window layer and the ohmic contact electrode. The current blocking structure can extend from the bottom surface of the ohmic contact electrode to the light-emitting layer.

According to the method for making the light-emitting device of the present invention, an epitaxial structure is formed on a substrate, wherein the epitaxial structure comprises an upper cladding layer, a bottom cladding layer, a light-emitting layer between the upper cladding layer and the bottom cladding layer, a window layer positioned on the upper cladding layer and a contact layer positioned between the window layer and the ohmic contact electrode. A photoresist layer with an opening is then formed on the epitaxial structure. At least one ionic implanting process is then performed to implant protons with a predetermined energy and dosage into the epitaxial structure below the opening to form a current blocking structure in the epitaxial structure. Subsequently, an ohmic contact electrode is formed on the epitaxial structure after the photoresist layer is stripped. The ionic implanting process can be performed before or after the ohmic contact electrode is completed.

Compared with the prior art, the present invention uses the ionic implanting technology to form the current blocking structure in the epitaxial structure and possesses the following advantages:

1. Since the present invention can perform the ionic implanting process to form the current blocking structure after all the epitaxial films are completed, the epitaxial wafer only has to go through the MOCVD reaction chamber once to complete all the epitaxial films.
2. The present invention can use a thinner window layer to achieve the spreading of the current from the ohmic contact electrode so that the epitaxial time for growing the films can be shortened.
3. The ionic implanting process is a stable and reliable technology, so the yield of the light-emitting device can be increased and the production cost can be decreased.

BRIEF DESCRIPTION OF THE SEVERAL VIEWS OF THE DRAWINGS

Other objectives and advantages of the present invention will become apparent upon reading the following description and upon reference to the accompanying drawings.

DETAILED DESCRIPTION OF THE INVENTION

Figure 6:
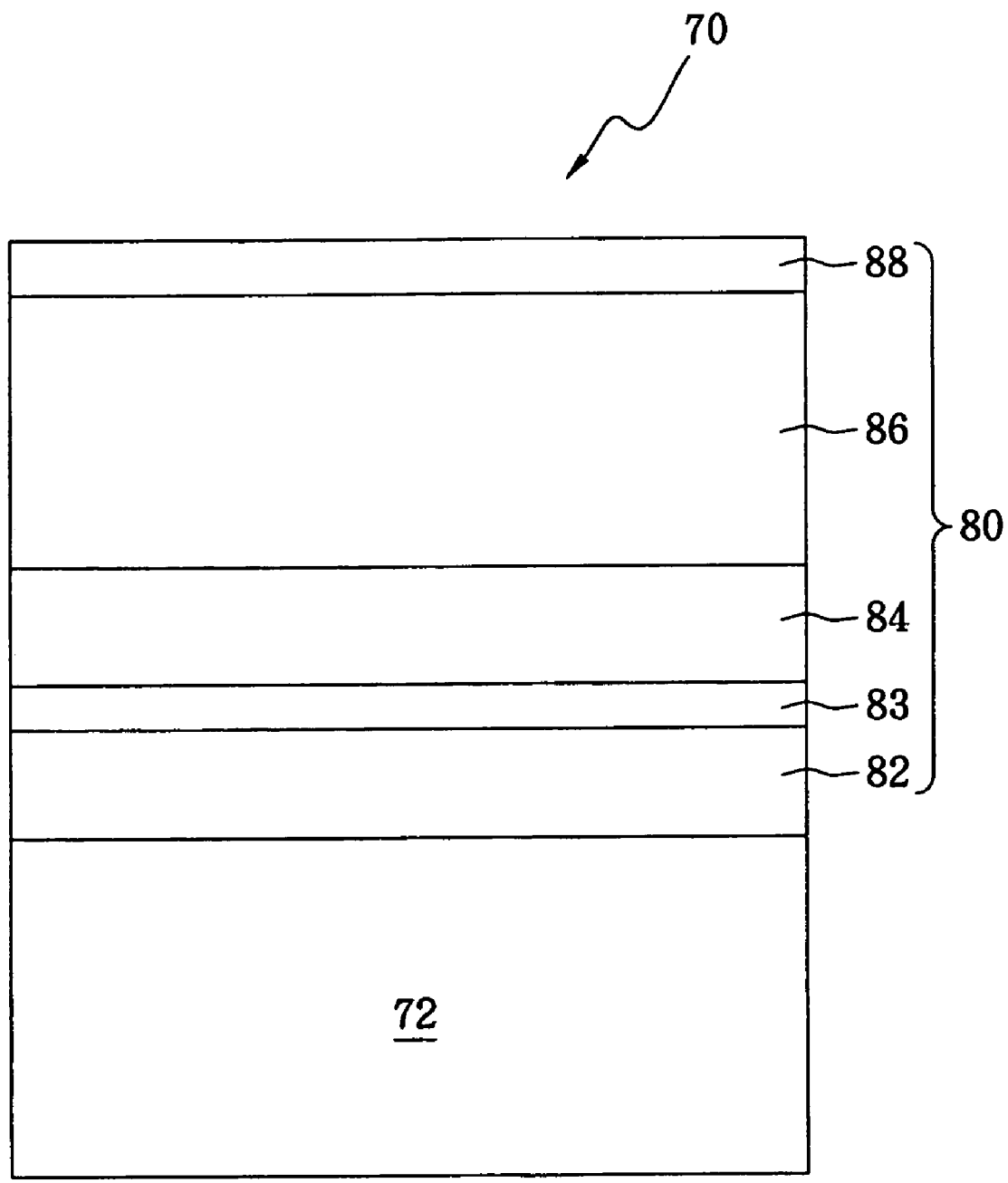
FIG. 6 to FIG. 8 are schematic views showing the present invention for making a light-emitting device according to the first embodiment of the present invention.
Figure 7:
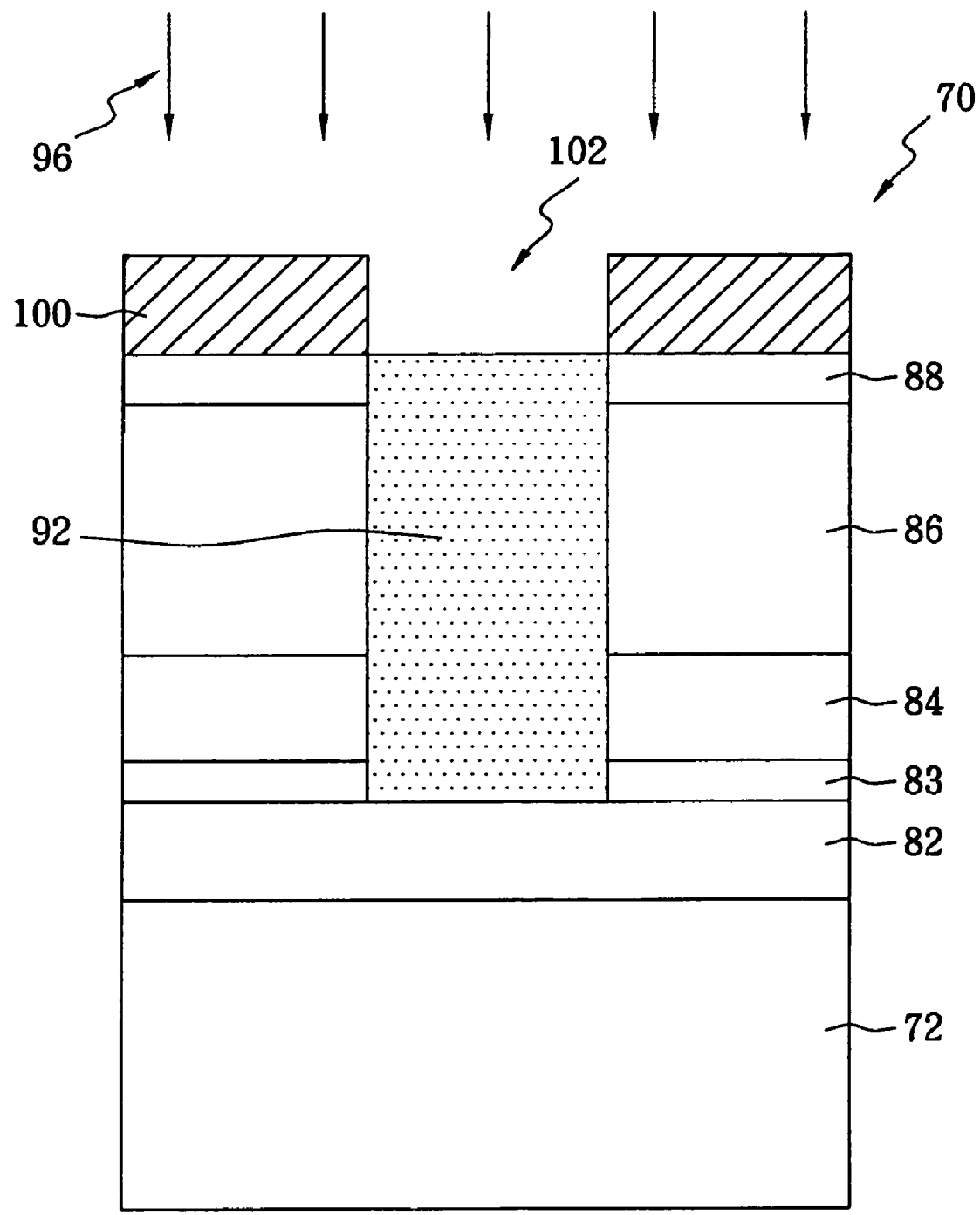
Figure 8:
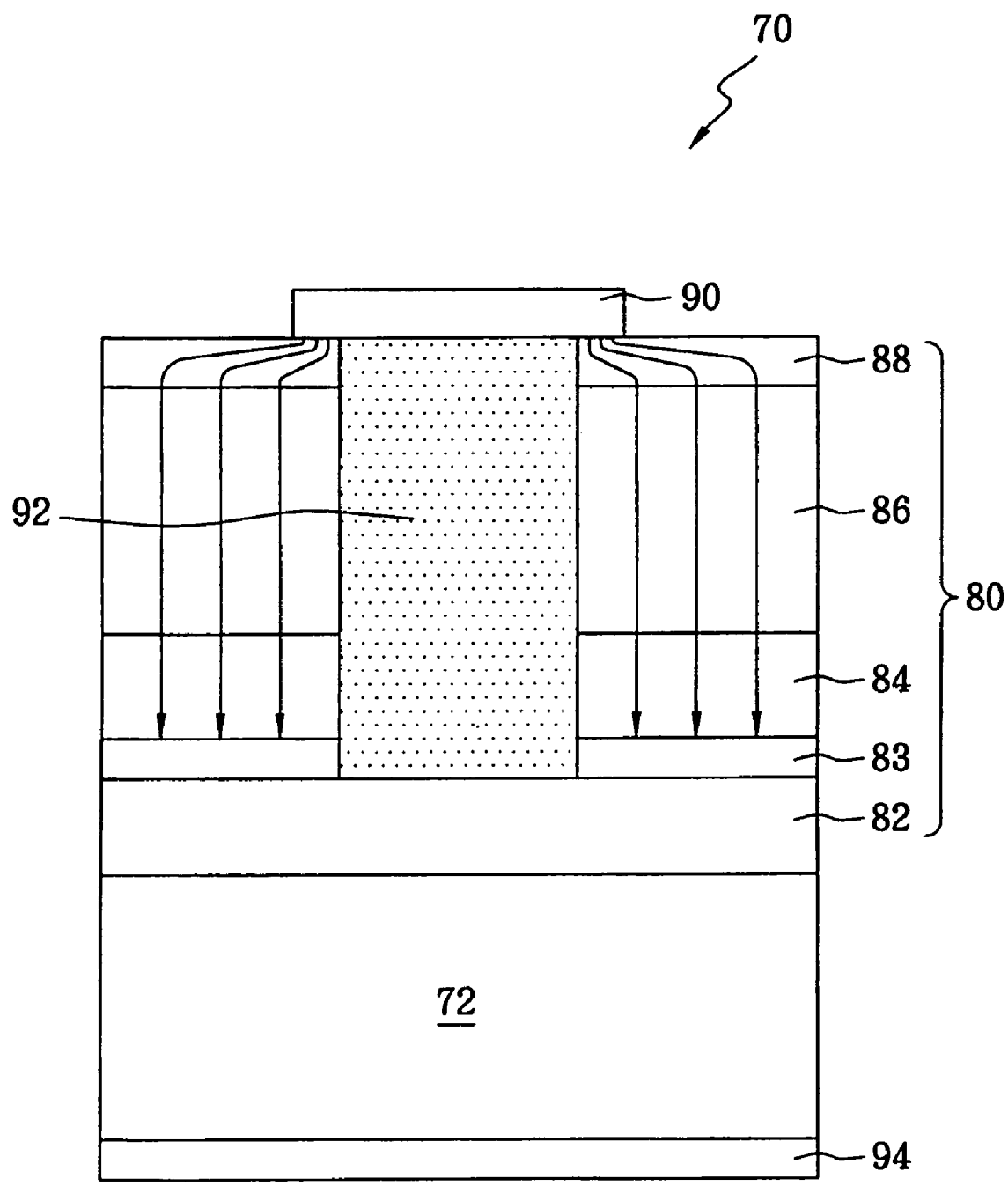

FIG. 6 to FIG. 8 are schematic diagrams showing the method for making a light-emitting device 70 according to the first embodiment of the present invention. As shown in FIG. 6, the present invention first forms an epitaxial structure 80 on a substrate 72, wherein the epitaxial structure 80 includes a bottom cladding layer 82, an upper cladding layer 84, a light-emitting layer 83 positioned between the bottom cladding layer 82 and the upper cladding layer 84, a window layer 86 positioned on the upper cladding layer 84 and a contact layer 88 positioned on the window layer 86. Generally speaking, since the resistance of the window layer 86 is too high to allow the current to spread laterally, the present invention introduces a gas containing a p-type dopant into the MOCVD reaction chamber during the epitaxial growth of the window layer 86 to form the contact layer 88 with a higher carrier density on the surface of the window layer 86.

A metallic film such as an aluminum film or a gold film with a thickness between 1000 and 2000 angstroms can be formed on the contact layer 88, and a photoresist layer is then formed on the metallic film by a spin-coating process. Subsequently, an alignment-mark in a crisscross shape is optionally formed on metallic film, which can be used in the alignment of the mask in the subsequent fabrication process after a soft-baking, a hard-baking, exposure, etching and stripping.

Referring to FIG. 7, a photoresist layer 100 with an opening 102 is formed on the contact layer 88 of the epitaxial structure 80. An ionic implanting process is then performed using the photoresist layer 10 as a hard mask to implant a proton beam 96 with a predetermined energy and dosage into the contact layer 88, the window layer 86, the upper cladding layer 84 and the light-emitting layer 83 right below the opening 102 so as to form a current blocking structure 92 in the epitaxial structure 80. The predetermined dosage is between $1\times10^{12}$ and $1\times10^{16}$ dopant/cm$^2$, while the predetermined energy is between 100 and 1000 keV. In addition to the proton, the nitrogen ion and the oxygen ion can be used in the ionic implanting process to form the current blocking structure 92. Besides, the ionic implanting process can implant a plurality of proton beams with different energies into the epitaxial structure, wherein the proton beam with higher energy can be implanted and the proton beam with lower energy is then implanted or the proton beam with lower energy is implanted before the proton beam with higher energy.

Referring to FIG. 8, after the photoresist layer 100 is stripped, a p-type ohmic contact electrode 90 is formed on the contact layer 88 and an n-type ohmic contact electrode 94 is formed on the other surface of the substrate 72 to complete the light-emitting device 70. The area of the opening 102 (the implanting region) is preferably smaller than that of the p-type ohmic contact electrode 90. For example, if the diameter of the p-type ohmic contact electrode 94 is 150 micrometers, the diameter of the opening 102 is preferably between 10 and 140 micrometers. The current blocking structure 92 of the light-emitting device 70 can extend from a region below the p-type ohmic contact electrode 90, such as the bottom surface of the p-type ohmic contact electrode 90, to the light-emitting layer 83 according to the present invention. Besides, the present invention can also increase the energy of the proton beam 96 to implant protons into the light-emitting layer 83 and even into the bottom cladding layer 82 below the opening 102 so that the current blocking structure 92 extends from the bottom surface of the p-type ohmic contact electrode 90 to the bottom cladding layer 82.

Since photons generated at the light-emitting layer 83 right below the p-type ohmic contact electrode 90 can not emit out of the light-emitting device 70, the present invention implants protons into the light-emitting layer 83 right below the p-type ohmic contact electrode 90 to avoid the current flow hereinto so as to avoid the generation of photons right below the p-type ohmic contact electrode 90. On the contrary, the current will flow to the light-emitting layer 83 outside of the p-type ohmic contact electrode 90 to generate photons, which can emit out of the light-emitting device 70 to increase the external quantum efficiency.

Figure 1:
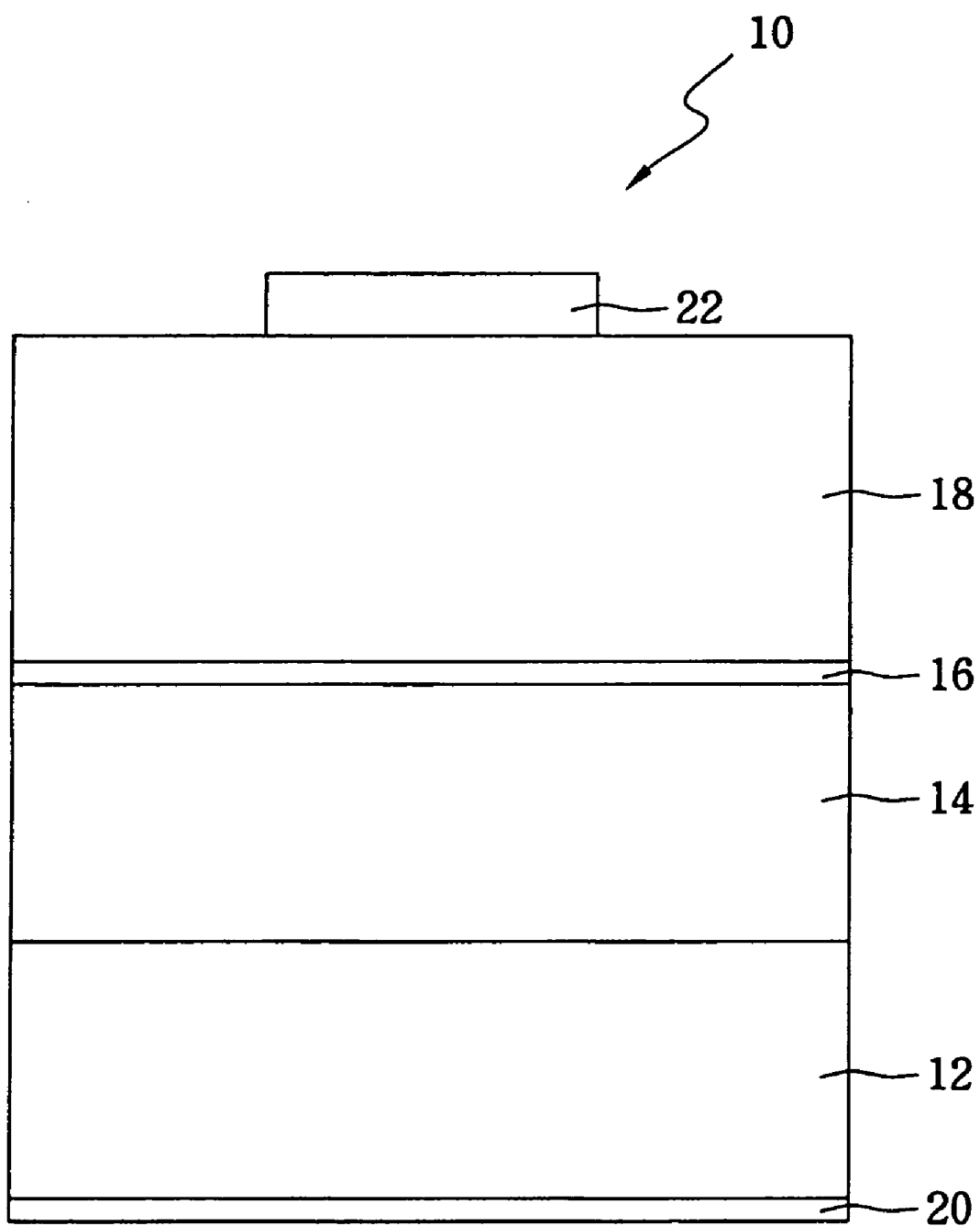
FIG. 1 is a cross-sectional view of a red light-emitting device according to the prior art.
Figure 2:
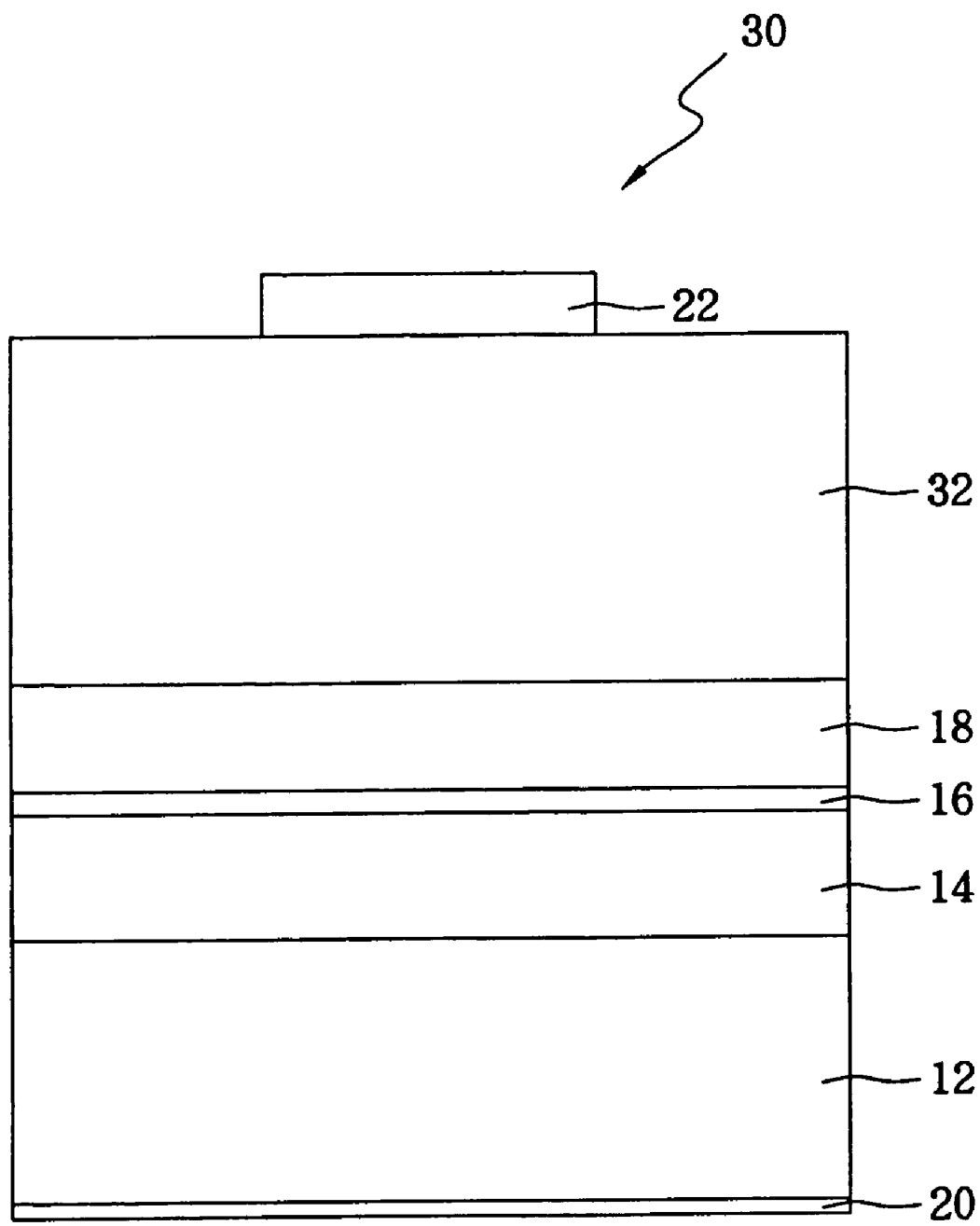
FIG. 2 is a cross-sectional view of another light-emitting device according to the prior art.
Figure 3:
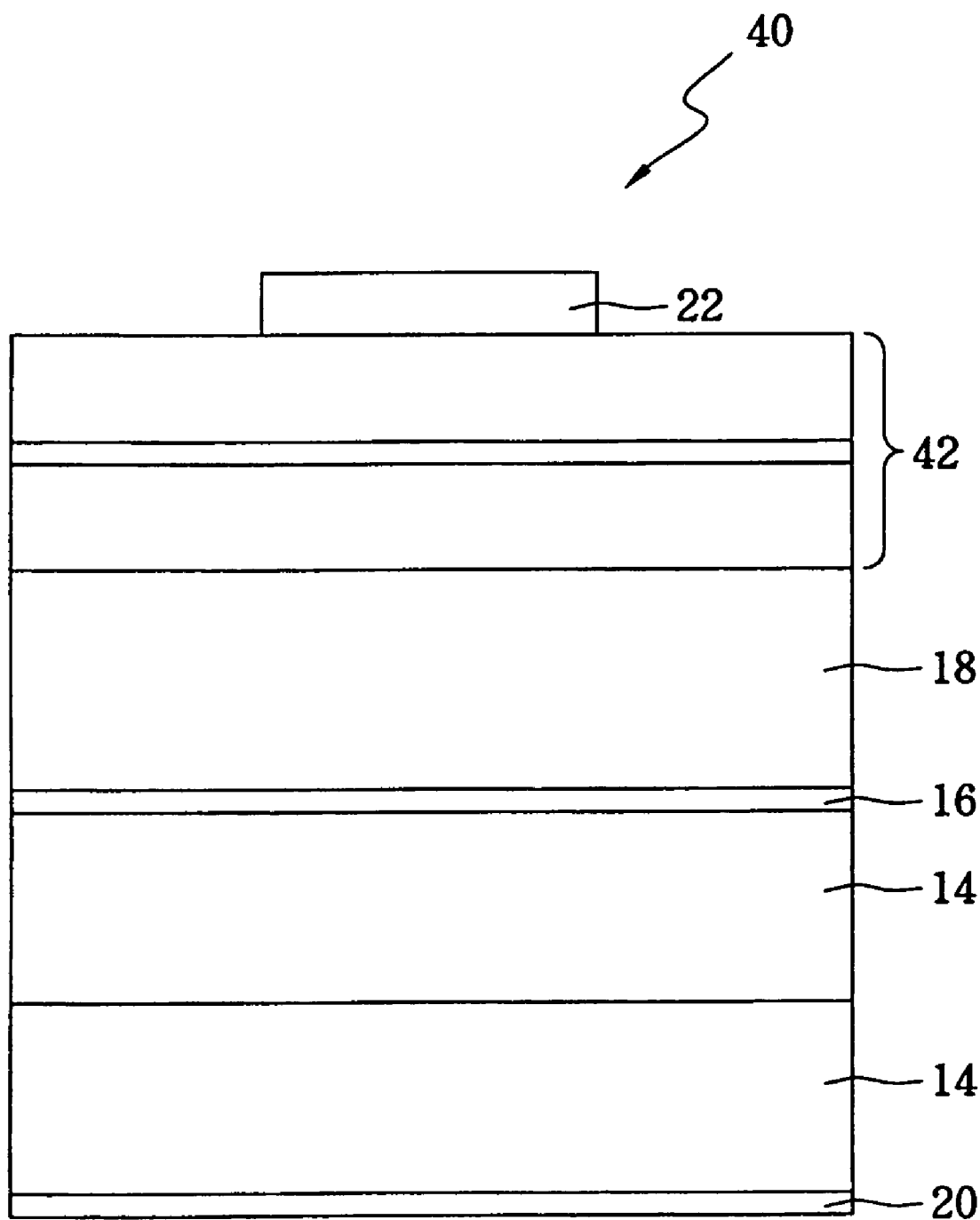
FIG. 3 is a cross-sectional view of another light-emitting device according to the prior art.
Figure 4:
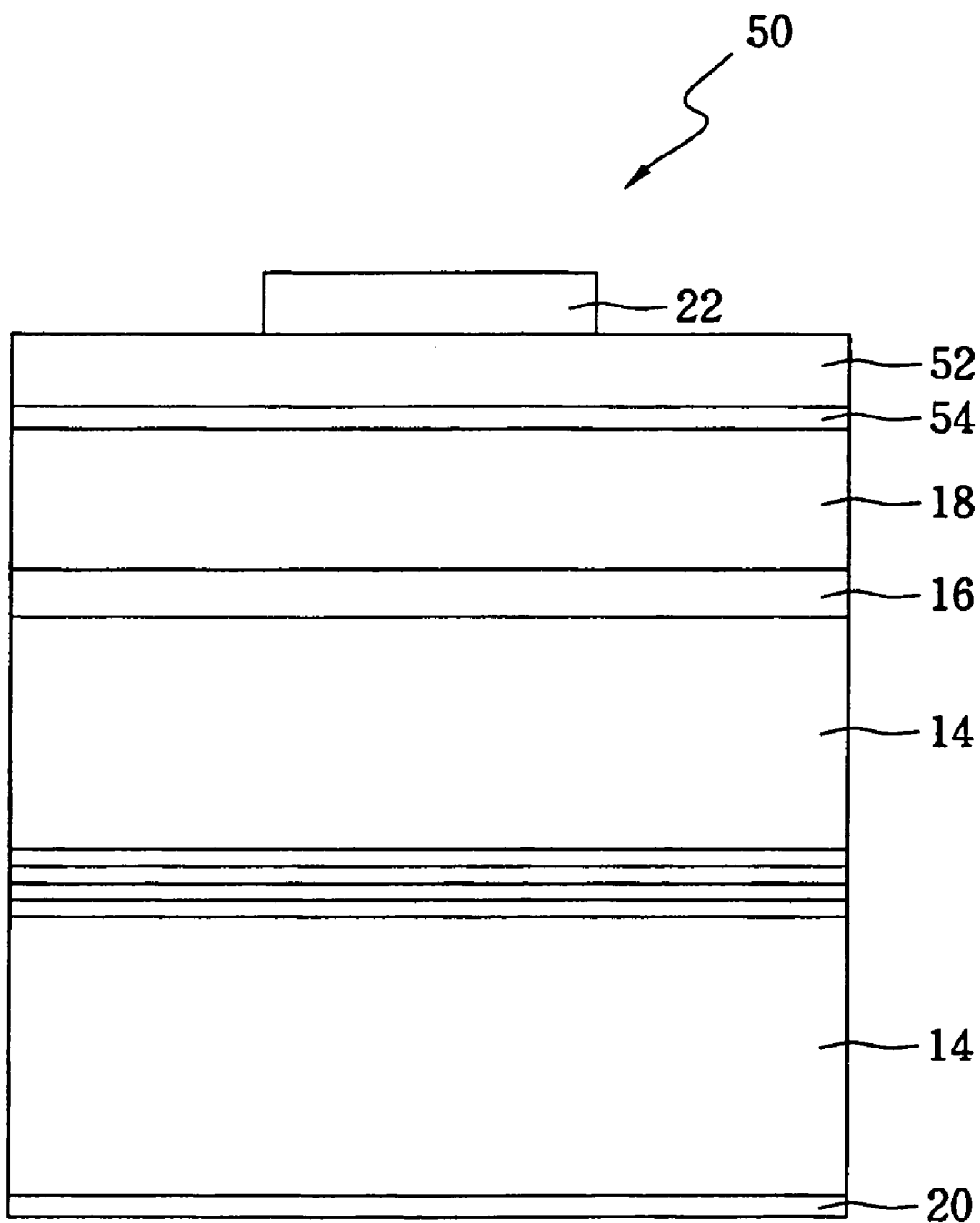
FIG. 4 is a cross-sectional view of another light-emitting device according to the prior art.
Figure 5:
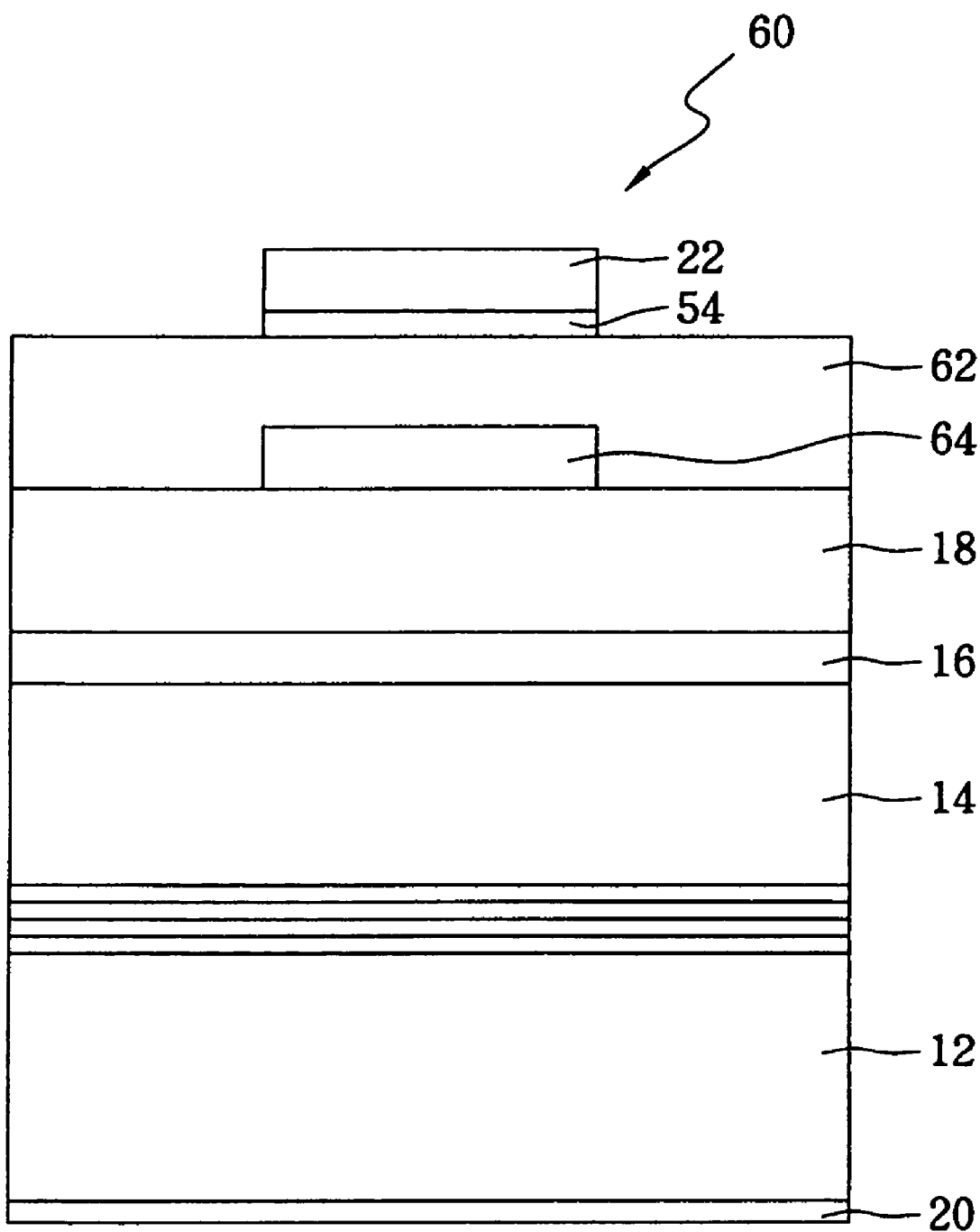
FIG. 5 is a cross-sectional view of another light-emitting device according to the prior art.

Compared with the prior art such as the light-emitting device 60 shown in FIG. 5, the present invention forms the current blocking structure 92 extending from the p-type ohmic contact electrode 90 to the light-emitting layer 83. When a forward current is applied to the light-emitting device 70, the current from the p-type ohmic contact electrode 90 will laterally spread in the contact layer 88 and then flow downward the light-emitting layer 83. In addition, the cylindrical current blocking structure 92 right below the p-type ohmic contact electrode 90 is semi-isolative and the current flows therethrough is impermissible, therefore the current tends to flow outside of the current blocking structure 92 and is injected into the light-emitting layer 83 outside the current blocking structure 92. As a result, the probability of the photons reflected by the p-type ohmic contact electrode 90 is dramatically decreased, and the external quantum efficiency of the light-emitting device 70 is dramatically increased.

Figure 9:
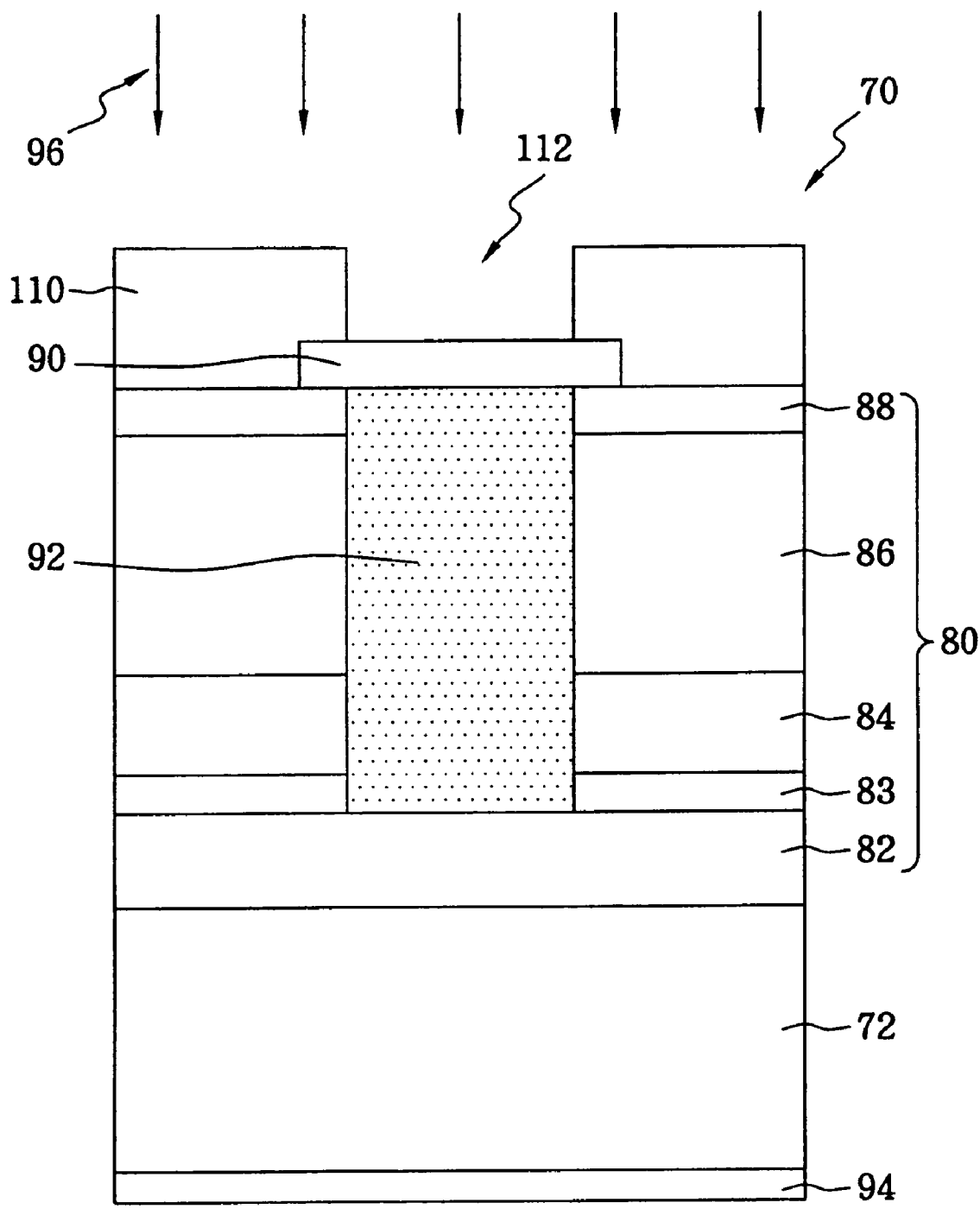
FIG. 9 is a schematic view showing the present invention for making a light-emitting device according to the second embodiment of the present invention.

FIG. 9 is a schematic diagram showing the method for making a light-emitting device 70 according to the second embodiment of the present invention. As shown in FIG. 9, the present invention first forms the epitaxial structure 80 on the upper surface of the substrate 72, the p-type ohmic contact electrode 90 on the epitaxial structure 80 and the n-type ohmic contact electrode 94 on the bottom surface of the substrate 72. A photoresist layer 110 with an opening 112 is then formed on the epitaxial structure 80. An ionic implanting process is performed using the photoresist layer 110 as a hard mask to implant a proton beam 96 with a predetermined energy and dosage into the contact layer 88, the window layer 86, and the upper cladding layer 84 right below the opening 112 to form a current blocking structure 92 in the epitaxial structure 80. Finally, the photoresist layer 110 is stripped to complete the light-emitting device 70.

The predetermined dosage is between $1\times10^{12}$ and $1\times10^{16}$ dopant/cm$^2$, while the predetermined energy is between 100 and 1000 keV. Since the proton beam 96 must penetrate through the p-type ohmic contact electrode 90, the energy of the proton beam 96 in the second embodiment is higher than that in the first embodiment. The p-type ohmic contact electrode 90 can be used as an alignment-mark for the alignment of the mask in the subsequent fabrication process, therefore it is not necessary for the second embodiment to fabricate the alignment-mark as the first embodiment, i.e., only two masks are necessary to define the implanting region and the position of the p-type ohmic contact electrode 90 according to the second embodiment, respectively. In addition, the present invention can control the energy and the dosage of the proton beam 96 to form a current blocking structure extending from any region below the p-type ohmic contact electrode 92, i.e., not originating from the bottom surface of the p-type ohmic contact electrode 92.

Compared with the prior art, the present invention uses the ionic implanting technology to form the current blocking structure in the epitaxial structure and possesses the following advantages:

1. The prior art uses the lithographic and etching process to fabricate the current blocking structure, therefore the epitaxial wafer must go through two epitaxial growth processes to complete all the epitaxial films. On the contrary, since the present invention can perform the ionic implanting process to form the current blocking structure after all the epitaxial films are grown, the epitaxial wafer only has to go through the MOCVD reaction chamber once to complete all the epitaxial films.
2. The present invention can use a thinner window layer to laterally spread the current from the ohmic contact electrode. Since the current blocking structure and the contact layer primarily spread the current laterally, the thickness of the window layer can be decreased to shorten the epitaxial time for growing the film.
3. The ionic implanting process is a stable and reliable technology, so the yield of the light-emitting device can be increased and the production cost can be decreased.

The above-described embodiments of the present invention are intended to be illustrative only. Numerous alternative embodiments may be devised by those skilled in the art without departing from the scope of the following claims.

We claim:

1. A method for making a light-emitting device with a current blocking structure, comprising the steps of:
    forming an epitaxial structure on a substrate, wherein the epitaxial structure includes a bottom cladding layer, an upper cladding layer, a light-emitting layer positioned between the bottom cladding layer and the upper cladding layer, and a window layer positioned on the upper cladding layer;
    forming a photoresist layer with at least one opening on the epitaxial structure;
    performing at least one ionic implanting process to implant dopants into a portion of the upper cladding layer, the light-emitting layer and the bottom cladding layer to form a current blocking structure inside the epitaxial structure;
    removing the photoresist layer; and
    forming an ohmic contact electrode on the epitaxial structure.

2. The method for making a light-emitting device with a current blocking structure of claim 1, wherein the ionic implanting process implants a proton beam with a predetermined energy and dosage into the epitaxial structure.

3. The method for making a light-emitting device with a current blocking structure of claim 2, wherein the predetermined dosage is between $1 \times 10^{12}$ and $1 \times 10^{16}$ dopant/cm$^2$.

4. The method for making a light-emitting device with a current blocking structure of claim 2, wherein the predetermined energy is between 100 and 1000 keV.

5. The method for making a light-emitting device with a current blocking structure of claim 1, wherein the ionic implanting process implants a plurality of proton beams with different energies into the epitaxial structure.

6. The method for making a light-emitting device with a current blocking structure of claim 1, wherein the ionic implanting process uses a dopant selected from the group consisting of proton, nitrogen ion and oxygen ion.

7. A method for making a light-emitting device with a current blocking structure, comprising the steps of:
    forming an epitaxial structure on a substrate, wherein the epitaxial structure includes a bottom cladding layer, an upper cladding layer, a light-emitting layer positioned between the bottom cladding layer and the upper cladding layer, and a window layer positioned on the upper cladding layer;
    forming an ohmic contact electrode on the epitaxial structure;
    forming a photoresist layer with at least one opening on the epitaxial structure; and
    performing at least one ionic implanting process to implant dopants into a portion of the upper cladding layer, the light-emitting layer and the bottom cladding layer to form a current blocking structure in the epitaxial structure.

8. The method for making a light-emitting device with a current blocking structure of claim 7, wherein the ionic implanting process implants a proton beam with a predetermined energy and dosage into the epitaxial structure.

9. The method for making a light-emitting device with a current blocking structure of claim 8, wherein the predetermined dosage is between $1 \times 10^{12}$ and $1 \times 10^{16}$ dopant/cm$^2$.

10. The method for making a light-emitting device with a current blocking structure of claim 8, wherein the predetermined energy is between 100 and 1000 keV.

11. The method for making a light-emitting device with a current blocking structure of claim 7, wherein the ionic implanting process implants a plurality of proton beams with different energies into the epitaxial structure.

12. The method for making a light-emitting device with a current blocking structure of claim 7, wherein the ionic implanting process uses a dopant selected from the group consisting of proton, nitrogen ion and oxygen ion.

* * * * *